United States Patent

Moazzami et al.

[11] Patent Number: 5,270,967
[45] Date of Patent: Dec. 14, 1993

[54] REFRESHING FERROELECTRIC CAPACITORS

[75] Inventors: Reza Moazzami, Oakland; James M. Jaffe, Santa Clara, both of Calif.

[73] Assignee: National Semiconductor Corporation, Santa Clara, Calif.

[21] Appl. No.: 642,022

[22] Filed: Jan. 16, 1991

[51] Int. Cl.$^5$ .................. G11C 11/22; G11C 7/00
[52] U.S. Cl. ................... 365/145; 365/222; 365/230.06
[58] Field of Search ............ 365/117, 145, 222, 230.06

[56] References Cited

U.S. PATENT DOCUMENTS

| | | | |
|---|---|---|---|
| 3,691,535 | 9/1972 | Williams | 365/145 |
| 3,737,879 | 6/1973 | Greene et al. | 365/222 |
| 3,950,737 | 4/1976 | Uchida et al. | 365/218 |
| 4,030,083 | 6/1977 | Boll | 365/222 |
| 4,481,610 | 11/1984 | Takemae et al. | 365/222 |
| 4,718,041 | 1/1988 | Baglee et al. | 365/222 |
| 4,736,344 | 4/1988 | Yanagisawa | 365/222 |
| 4,809,225 | 2/1989 | Dimmler et al. | 365/145 |
| 4,820,941 | 4/1989 | Dolby et al. | 365/226 |
| 4,853,893 | 8/1989 | Eaton, Jr. et al. | 365/145 |
| 4,860,254 | 8/1989 | Pott et al. | 365/145 |
| 4,873,664 | 10/1989 | Eaton, Jr. | 365/145 |
| 4,943,960 | 7/1990 | Komatsu et al. | 365/222 |
| 4,982,370 | 1/1991 | Matsumoto et al. | 365/222 |
| 5,086,412 | 2/1992 | Jaffe et al. | 365/145 |
| 5,109,357 | 4/1992 | Eaton, Jr. | 365/145 |

FOREIGN PATENT DOCUMENTS 338158  10/1989  European Pat. Off. .

OTHER PUBLICATIONS

"Ferroelectric Memories", Scott, et al., *Science,* vol. 246, pp. 1400–1405, Dec. 15, 1989.
"A 16kb Ferroelectric Nonvolatile Memory with a Bit Parallel Architecture" by Womack, et al., IEEE International Solid-State Circuits Conference, Feb. 1989, U.S.A.
"Analysis of Thin Film Ferroelectric Aging" by Fisch, et al., 28th Annual IEEE Proceedings, *Reliability Physics,* Mar. 1990, U.S.A.
Technical Article, dated Dec. 15, 1989. Scott and Araujo *Science,* vol. 246 pp. 1400–1405. Dec. 15, 1989.

*Primary Examiner*—Eugene R. LaRoche
*Assistant Examiner*—Christopher R. Glembocki
*Attorney, Agent, or Firm*—Richards, Medlock & Andrews

[57] ABSTRACT

The endurance of ferroelectric capacitors can be extended by refreshing the ferroelectric material. The ferroelectric material is refreshed by impressing a voltage across the ferroelectric capacitor, which voltage is higher than that which the capacitor experiences during normal operation. A memory array having ferroelectric capacitive cells can be refreshed by first reading the memory cells, temporarily storing the data in associated sense amplifiers, refreshing the memory cells by impressing a higher-than-normal voltage across the ferroelectric cell capacitors, then rewriting the temporarily stored data back into the memory cells. Refresh circuits connected between the drive line and bit line common to a number of cells are driven with voltages which are higher than the memory cell experiences during normal read operations. A $V_{cc}$ to ground pulse train is applied to the drive line, while an inverted waveform thereof is applied to the bit line during refresh operations.

49 Claims, 4 Drawing Sheets

REFRESHING FERROELECTRIC CAPACITORS

TECHNICAL FIELD OF THE INVENTION

The invention relates in general to refreshing of ferroelectric capacitors. In one aspect, the invention relates to methods and apparatus for refreshing memory arrays having ferroelectric capacitors cells to increase the long-term endurance thereof.

BACKGROUND OF THE INVENTION

The advancement of the integrated circuit technology has enabled millions of memory cells to be fabricated on a single semiconductor chip. This is admittedly a much desired achievement in view of the traditional magnetic core-type of memories which were both slow and required substantial physical space. However, the magnetic core memories were nonvolatile, i.e., the cells maintained an electrical state even when power was removed from the unit, whereas the semiconductor dynamic random access memories (DRAMs) and static random access memories (SRAMs) are generally of the volatile type where all of the data information is lost when power is removed from the chips. Although the packaging density of DRAM cells is high due to the single transistor configuration, currently up to 4 or 16 megabit per chip, the cells require refresh every 10-15 milliseconds to restore the charge on the cell capacitors. With this frequency of refresh, there is required either on or off-chip circuitry dedicated to such refresh operations.

In response to a need for nonvolatile semiconductor memories, there have been developed semiconductor memories known as an electrical programmable read only memory (EPROM), and an electrically erasable programmable read only memory (EEPROM). These nonvolatile semiconductor memories can indeed maintain the stored information when the power is removed from the devices, but such devices normally have much slower write speeds and require high voltage write circuits. Also, such memory devices are useful for a limited number of write operations as the nonvolatile storage mechanism decays as a function of the number of times the cell is written. The mechanism by which such nonvolatile storage is made possible is the formation of an electron tunnel charge in a transistor gate area of the cell, which charge remains irrespective of the supply voltage applied to the cell.

Another type of nonvolatile memory is the battery-backed SRAM. This type of memory generally has a six-transistor cell with a miniature battery molded in the package encapsulant. Although power remains on the chip when the package is removed from its socket, the memory arrays cannot be made large due to the number of transistors required per cell.

In the recent development of nonvolatile semiconductor memories, ferroelectric materials have been utilized as a storage mechanism for each cell. Particularly, a ferroelectric capacitor can be polarized with a specified state, which state can be maintained even in the absence of a voltage applied to the cell. One substantial advantage of the use of ferroelectric capacitive elements in the memory cells is that the packaging densities approach that of semiconductor DRAM memories, and the read and write speeds are also comparable. However, a major disadvantage of the use of ferroelectric material in memories is that there exists a gradual loss of detectable ferroelectric polarization as a result of repeated switching due to normal read and write operations of the cell. It is apparent, therefore, that even though the packaging density and write speeds of ferroelectric memory cells represent a significant improvement over prior EPROMs and EEPROMs, the useful life of the ferroelectric memories is still limited, albeit due to a different electrical mechanism.

From the foregoing, it can be seen that a need exists for a technique to extend the endurance of ferroelectric-type capacitors. A further need exists for methods and apparatus for reading and writing ferroelectric memories in such a manner as to extend the life thereof, well beyond that of present-day nonvolatile semiconductor memories. Another need exists for a ferroelectric memory having circuitry adapted for refreshing each of the capacitors in the array.

SUMMARY OF THE INVENTION

In accordance with the invention, methods and apparatus are disclosed for extending the endurance of ferroelectric components. According to a broad aspect of the invention, ferroelectric components are periodically exercised to refresh, or reestablish, the polarization state to extend the life of such memories. According to the preferred embodiment of the invention, a higher-than-normal voltage is impressed across the ferroelectric element to activate and repolarize those domains which have become inactive during normal operation of the ferroelectric element.

According to the preferred form of the invention, a number of ferroelectric-type memory cells are arranged in an array such that during a refresh sequence, a normal read operation is carried out to temporarily store the data in associated sense amplifiers. Then, an increased voltage is applied to the cell capacitors to refresh the ferroelectric material. Thereafter, the temporarily stored data is rewritten back into the respective cells. It has been found that with an elevated voltage impressed across the ferroelectric capacitors, the ferroelectric material itself is refreshed, and the capacitor is then capable of extended read/write operations. By periodically refreshing the ferroelectric capacitors, it is believed that the life of such memories can be extended to at least $10^{15}$ additional read/write memory accesses.

Particularly, since each ferroelectric capacitor is connected in a cell between a drive line and a bit line by a pass transistor, a voltage applied between the drive line and the bit line during the refresh operation can be increased to impress a higher than normal magnitude voltage across the ferroelectric capacitors. In an array of such ferroelectric capacitor cells, the drive lines and bit lines common to a number of cells are connected to refresh circuitry. During a refresh operation, the full supply voltage is applied across the ferroelectric capacitor, via the drive line and bit line. This provides an increased potential across the cell capacitor of about twice that to which the capacitor is subjected during normal read operations. Preferably, the refresh operation is carried out by subjecting each cell capacitor to a train of pulses of the supply voltage magnitude.

It is contemplated that on a long-term basis, for example after a number of memory access cycles, a refresh operation of each ferroelectric memory cell will be conducted. An on-chip counter is effective to totalize the number of memory accesses, and on a predetermined count, circuitry will be activated to apply an increased voltage across the ferroelectric elements during a refresh operation.

Because the ferroelectric cells require only an occasional refresh, such operation can be carried out under control of processor software, thereby reducing hardware constraints otherwise required in the DRAM-type memories themselves. In addition, the long-term refresh requirements of ferroelectric memories reduce the problem of interrupting normal read/write access, such as in DRAMs, where a refresh operation is required every 10-15 milliseconds.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, elements or functions throughout the views, and in which.

DETAILED DESCRIPTION OF THE INVENTION

The use of ferroelectric capacitors as nonvolatile memory storage elements is well documented in the art. However, as noted above, a major shortcoming with ferroelectric material is that the ability to store polarization states degrades over time, thereby reducing the endurance of the memories. As used herein, the term "endurance" relates to the number of read/write cycles which can be carried out in accessing a memory before a noticeable degradation occurs in the capability to reliably store data. It has been found that there exists certain techniques for "refreshing" the ferroelectric capacitors to thereby increase the endurance of such type of memories. The various refresh techniques and circuits are described in detail below.

Figure 1:
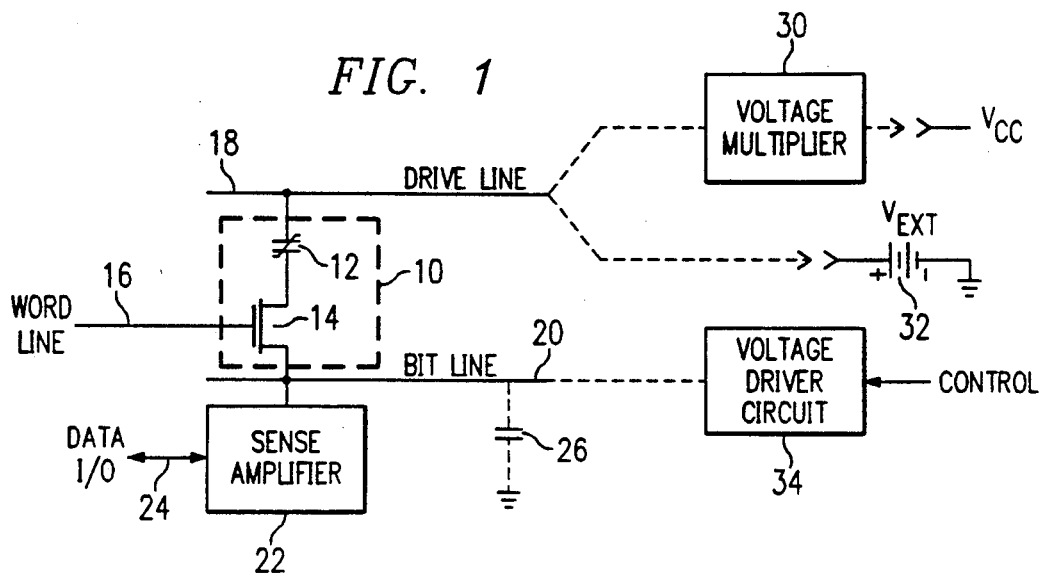
FIG. 1 is a generalized circuit diagram of a ferroelectric capacitor cell and circuits adapted for refreshing the ferroelectric components.

With reference to FIG. 1, there is illustrated a conventional ferroelectric cell 10 having a ferroelectric capacitive element 12 connected in series with a switching transistor 14. The transistor 14 is driven by a signal on a word line 16 to connect the ferroelectric capacitor 12 between a drive line 18 and a bit line 20. In large memory arrays, the word line 16, the drive line 18 and the bit line 20 are connected in common to other memory cells arranged in rows and columns. A sense amplifier 22 is connected to the bit line 20 for sensing whether a digital one or zero has been read from an accessed cell connected to the bit line 20. The data state read from any cell connected to the bit line 20 can be sensed and latched by the sense amplifier 22. The sense amplifier 22 includes an input/output (I/0) terminal 24 for providing an output logic signal corresponding to that stored in the accessed cell. During write operations, the I/0 terminal 24 can be driven by a digital signal, whereby the sense amplifier 22 is effective to cause a corresponding polarization state to be stored in an accessed memory cell. Importantly, the memory architecture shown in FIG. 1 depends upon a parasitic capacitance 26 associated with each bit line 20. The desired bit line capacitance 26 can be modified by adding sufficient capacitance thereto during the semiconductor fabrication process. The parasitic bit line capacitance 26 is important during read operations. During a read operation, the transistor 14 is conductive, and a pulse is applied to the drive line 18, whereupon the charge stored in the ferroelectric capacitor 12 is partially transferred to the bit line parasitic capacitance 26, in a proportion based on the relative capacitance between the capacitors 12 and 26. Preferably, the capacitance of the ferroelectric capacitor 12 is about equal to that of the parasitic bit line capacitance 26. In this manner, a charge read out of the ferroelectric capacitor 12 distributes about evenly between the two capacitors 12 and 26. In like manner, a voltage developed across the ferroelectric capacitor 12 and the bit line parasitic capacitance 26 is also about equal. It should be understood that the voltages developed across the capacitors 12 and 26 during the read operation will be low when the ferroelectric capacitor 12 stores one polarization state, and will be higher when the ferroelectric capacitor 12 stores the opposite polarization state. Nonetheless, the highest voltage developed across the ferroelectric capacitor during a read operation is only about 2-3 volts, with a supply voltage of about 5 volts. As noted above, data can be written into the ferroelectric capacitor 12 by applying a desired data state to the I/O input 24. The sense amplifier 22 then impresses a corresponding voltage on the bit line 20. An opposite polarity voltage can then be applied to the drive line 18 and with the transistor 14 rendered conductive, an appropriate polarization state can be stored in the ferroelectric capacitor 12.

According to one technique, the ferroelectric capacitor 12 can be refreshed by applying appropriate voltages between the drive line 18 and the bit line 20, as driven by the sense amplifier 22. In other words, the output of the sense amplifier 22 can be driven to a predefined high or low voltage, and an opposite polarity voltage can be applied to the drive line 18. Of course, the transistor 14 would be driven into conduction to connect the ferroelectric capacitor 12 between the drive line 18 and the output of the sense amplifier 22. Circuit voltages higher than the normal supply voltage ($V_{cc}$) can be applied to the drive line 18, such as by a voltage multiplier circuit 30. An on-chip voltage multiplier 30 can be driven from the external $V_{cc}$ supply voltage and coupled by way of a switch or transistor (not shorn) to the drive line 18. In the alternative, the drive line 18 can be switchably connected to an external supply voltage ($V_{external}$) which is larger than the chip supply voltage $V_{cc}$. Of course, the voltage of increased magnitude would typically be coupled through drive line decoders which are described in more detail below. In the same manner, circuits within the sense amplifier 22 can be switchably connected to the bit line 20 to provide increased voltages for refresh purposes.

While the sense amplifier 22 is typically connected directly to the bit line 20, the sense amplifier 22 is an appropriate circuit to control the bit line voltage for memory refresh purposes. However, and in accordance with an important feature of the invention, the bit line 20 itself can be extended to other memory circuits for providing an increased voltage directly to the bit line 20, without altering or modifying the operation of the sense amplifier 22. In another form of the invention, a voltage driver circuit 34 provides sufficient current drive capabilities to refresh a number of ferroelectric capacitors simultaneously. In this manner, when the switching transistor 14 is driven into conduction, appropriate polarity voltages can be applied directly between the drive line 18 and the bit line 20, thereby impressing an increased magnitude voltage across the ferroelectric capacitor 12. The voltage driver circuit 34 can be fabricated to provide either or both an increased positive and/or negative voltage to the bit line 20. As used herein, and in the context of memory applications, the "higher than normal" refresh voltage is a voltage applied across the ferroelectric capacitor which is greater than the voltage that the capacitor 12 encounters during normal read or write operations. In other applications, a "higher than normal" refresh voltage is simply a voltage to which the ferroelectric capacitor is exposed which is greater than that which the capacitor experiences during normal operational periods.

Figure 2:
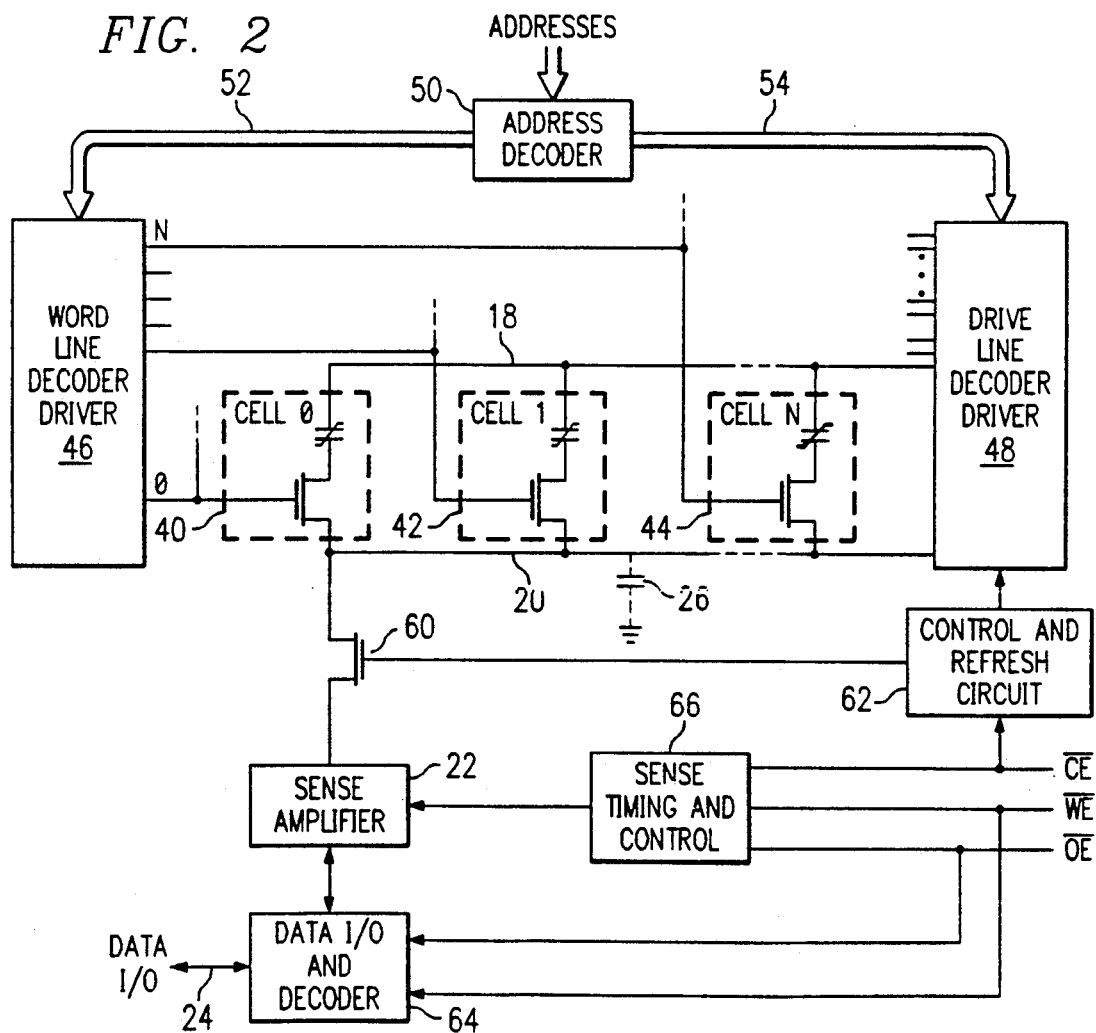
FIG. 2 is a block diagram of a memory chip of the invention, illustrating the major structural features.

With reference now to FIG. 2, there is illustrated the major circuits of a ferroelectric memory according to the invention. Shown are a number of ferroelectric memory cells 40, 42 and 44, each defined by a transistor and a ferroelectric capacitor. Although three memory cells are shown in a row, a typical ferroelectric memory would have many more rows, such as 1024. In addition, the memory cells 40, 42 and 44 would also be included in different columns of the array, which columns would be associated with many other similar memory cells. Accessing one or more of the memory cells is accomplished by word line decoders, one of which is shown as reference numeral 46. Also shown is one of the many drive line decoders 48. An address decoder 50 receives addresses from the terminals of the memory chip and provides appropriate signals by way of buses 52 and 54 to the respective word line decoder 46 and the driver line decoder 48. The word line decoder 46 is effective to decode the address on bus 52 and drive an appropriate output. The memory array of FIG. 2 is shown with one cell in a row being addressed. However, each output of the decoder 46 is connected to many similar cells in an array column.

In like manner, the drive line decoder 48 decodes address signals on the address bus 54 and selects an appropriate output drive line. For each different address on the input bus 54, a different drive line is selected and driven by the decoder 48. As shown, when drive line 18 is selected and driven, the voltage thereon is coupled to each of the ferroelectric capacitors of memory cells 40, 42 and 44. The other drive lines connected to the decoder 48 are coupled to other rows of memory cells in the array.

In accordance with an important feature of the invention, the bit line 20 is also connected to the drive line decoder 48 so that both the drive line 18 and the bit line 20 can be controlled during the refresh operation. An isolation transistor 60 is connected between the bit line 20 and the sense amplifier 22 to provide isolation therebetween during periods of normal memory operation, as well as during the entire refresh operation. A control and refresh circuit 62 is connected to the drive line decoder 48 to provide control signals thereto. The refresh circuit 62 is also connected to the isolation transistor 60. The circuit 62 includes an oscillator operating at about a 5-10 MHz frequency for providing a plurality of voltage pulses to the drive line decoder circuits 48.

The sense amplifier 22 is connected by way of the isolation transistor 60 to the bit line 20, and thus to a number of memory cells in the row. In the preferred embodiment of the invention, the sense amplifier 22 operates in a conventional latching manner to sense voltages on the bit line 20 and latch the same as digital signals for transfer to the data I/O and decoder circuit 64. Also connected to the sense amplifier 22 is a sense timing and control circuit 66. A chip enable signal is applied to the sense timing and control circuit 66, as well as to the control and refresh circuit 62. A write enable signal is applied externally from the chip to the sense timing and control circuit 66, as well as to the data I/O and decoder 64. Lastly, an output enable signal is applied to both the sense timing circuit 66 and the data I/O circuit 64. Data signals input and output with respect to the memory chip are by way of the I/O 24. The chip enable signal is applied whenever the memory chip is to be accessed, whether it be a read or write operation. The write enable signal, when in one state, initiates a write operation of the memory cell accessed, while in the other state initiates a read operation of the memory cell accessed. The output enable signal determines primarily whether data is to be output on line 24 during a read operation, or whether data is to be input on the line 24 so that it can be written into an accessed memory cell. Although the memory circuit shown in FIG. 2 is configured with regard to a particular arrangement for accessing particular memory cells in the array, other arrangements can be utilized with equal effectiveness.

The operation of the memory shown in FIG. 2 is described briefly below, with regard only to the refresh operation. The entire refresh sequence, which includes a read, refresh and rewrite operation, is described more fully below. The control and refresh circuit 62 includes a counter responsive to the number of chip enable signals to count the number of times the memory array has been accessed. In response to a predefined count, an oscillator is triggered to provide a pulse train of refresh signals to the drive line decoder 48. In response to certain addresses, the address decoder 50 provides appropriate address signals on buses 52 and 54 to the respective word line decoder 46 and the drive line decoder 48. Switching transistors of the accessed memory cells are driven into conduction, and the oscillator voltage, driven between the positive and negative supply voltages, is applied between the drive line 18 and the bit line 20. The isolation transistor 60 remains in a nonconductive state, thereby isolating the row of memory cells from the sense amplifier 22 which temporarily stores cell data. Preferably, the refresh voltage is a few cycles of a square wave which oscillates between the supply voltage $V_{cc}$ and ground, which voltage is applied between the drive line 18 and the bit line 20. With one or more of the cell transistors turned on, such voltage is applied directly across the ferroelectric capacitors to refresh or revitalize the ferroelectric material. Once initiated, the refresh operation is preferably carried out such that every cell on the chip is refreshed. A full complement of addresses can be provided externally during the refresh operation and applied to the array by way of the address decoder 50. In practice, the address decoder 50 comprises both row and column addresses. In the alternative, there can be provided an on-chip address counter which is triggered by the control and refresh circuit 62. While not shown, the on-chip address counter can be multiplexed to the address decoder 50 for internally providing all of the addresses for refreshing all cells of the array.

While the memory refresh operation can occur at any time, preferably it occurs after a read operation in the refresh sequence, in which event the accessed memory cell is first read and the isolation transistor 60 is driven into conduction so that the sense amplifier 22 can temporarily store the data read from the cell. Next, the refresh operation is carried out with the isolation transistor 60 being cut off, and thereafter driven into conduction so that the data temporarily stored in the sense amplifier 22 can be rewritten back into the respective cell.

Figure 3:
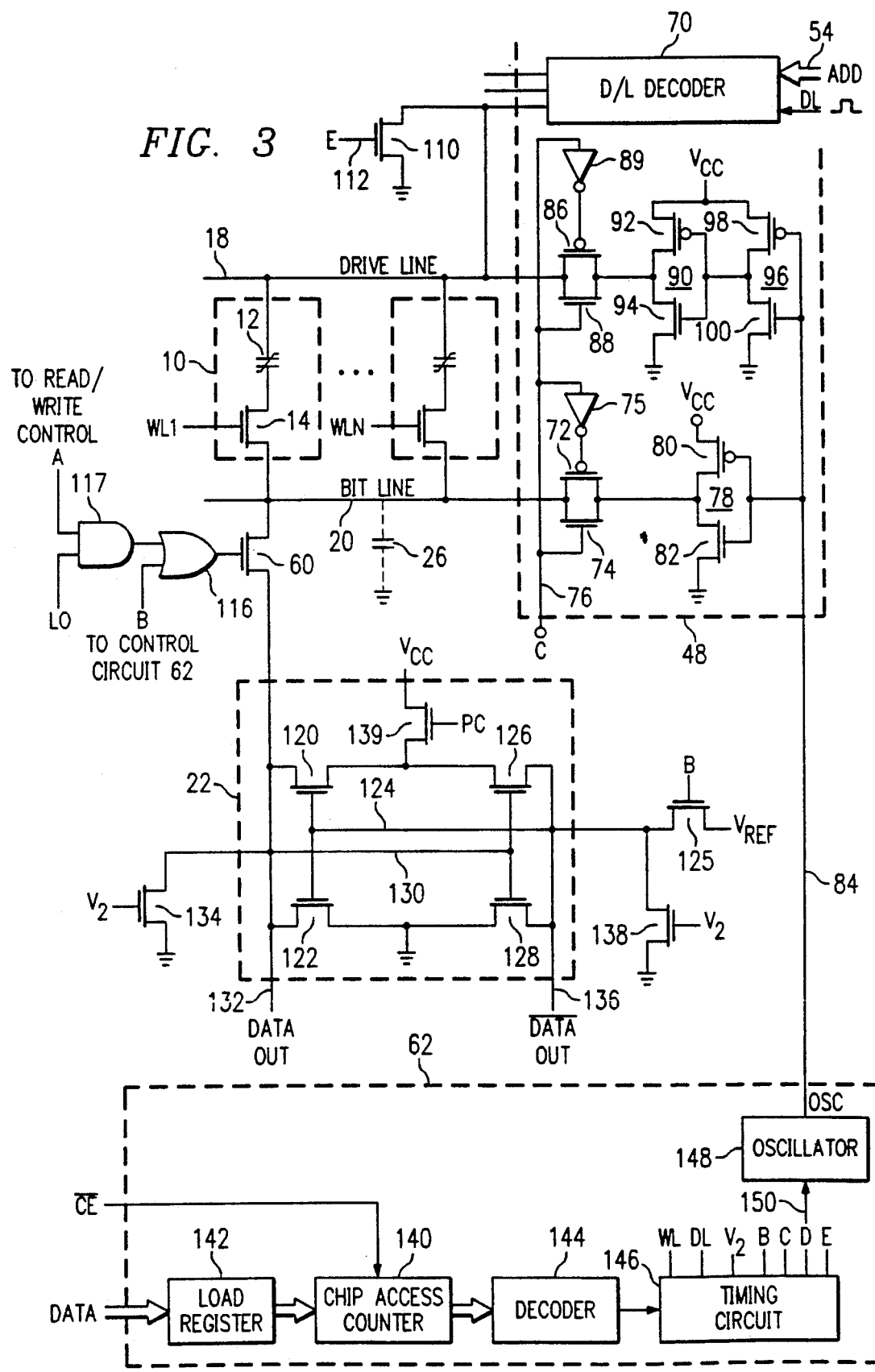
FIG. 3 is a schematic diagram of the various on-chip refresh circuits of the invention.
Figure 4:
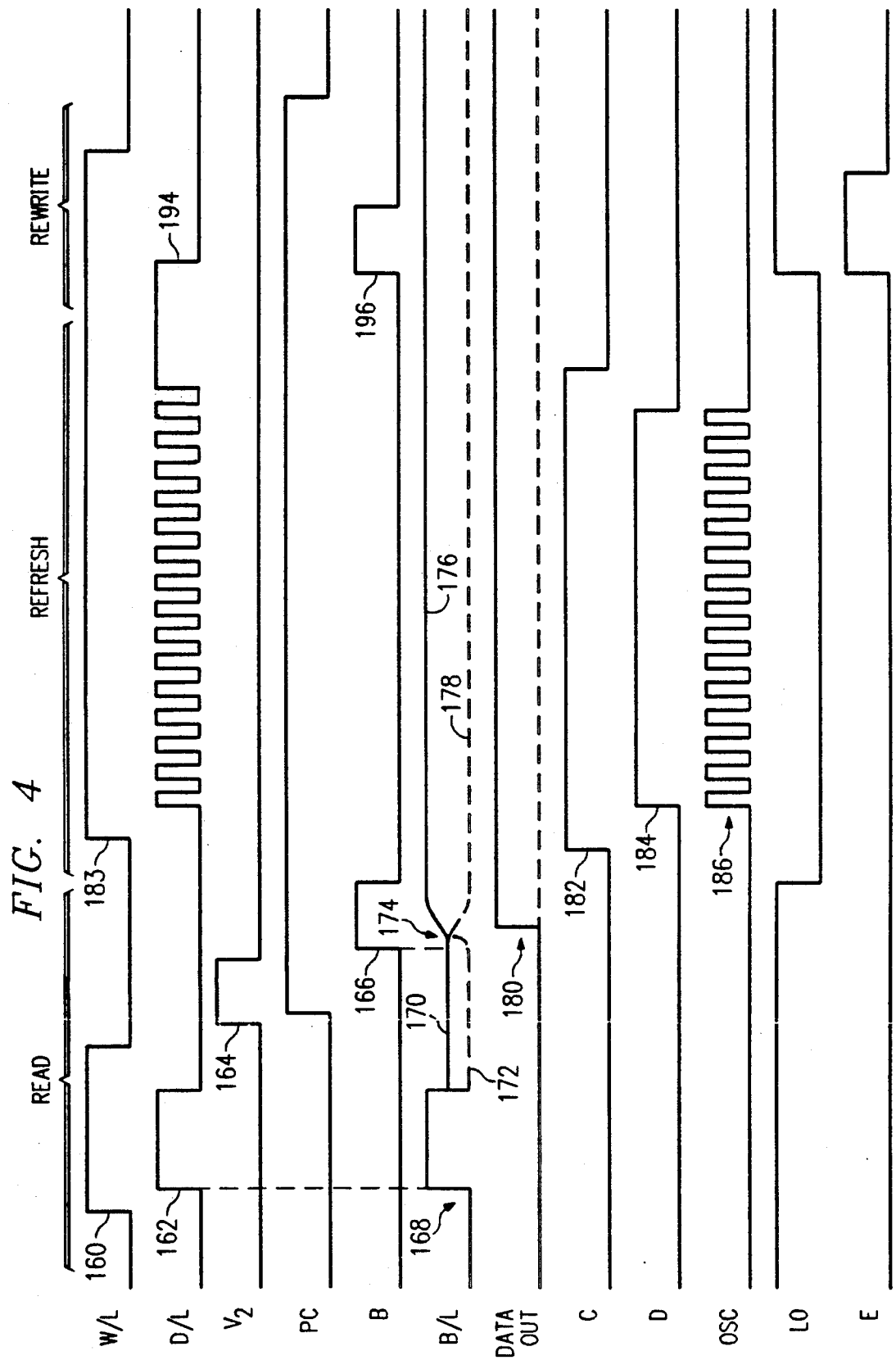
FIG. 4 is a timing diagram of refresh signals which control the various circuits to achieve refresh of the ferroelectric components.

The detailed structure and operation of the invention is described in more detail in FIGS. 3 and 4. The drive line decoder 48 includes a conventional drive line address decoder 70 for decoding input addresses on bus 54 and selecting a particular drive line. One output of the drive line decoder 70 is shown connected to the drive line 18. The other outputs of the drive line decoder 70 are connected to other drive lines (not shown). Refresh circuits within the decoder 48 include a first transfer gate defined by a p-channel transistor 72 and an n-channel transistor 74 with typical parallel connected drain-source connections. The gate of transistor 74 is connected to an input 76, while the gate of transistor 72 is connected to the input 76 through an inverter 75. The transfer gates 72 and 74 allow a full supply voltage to be applied between the bit line 20 and a drive circuit 78. With a logic low signal applied to the C input 76, both transistors 72 and 74 provide isolation between the bit line 20 and the drive line decoder 48. The drive circuit 78 comprises a CMOS pair of transistors defined by a p-channel transistor 80 connected in series with an n-channel transistor 82, the series combination being connected between the supply voltage $V_{cc}$ and ground. The drain terminal of the p-channel transistor 80 is connected to the drain terminal of the n-channel transistor 82, the junction thereof being connected to the transfer gates 72 and 74. The gate terminals of the CMOS driver circuit 78 are connected together and to an input oscillator line 84. The CMOS transistor pair 78 functions to invert the signal provided on oscillator input 84, and provide current drive to the bit line 20 via the transistor gates 72 and 74.

A second transfer gate, defined by p-channel transistor 86, an n-channel transistor 88, and an inverter 89 are connected together and function in the same manner as transfer gates 72 and 74 and inverter 75, but with respect to the drive line 18 and a CMOS transistor pair 90. The CMOS transistor pair 90 is defined by a p-channel transistor 92 and an n-channel transistor 94 configured substantially identical to the CMOS transistor pair 78. Again, the CMOS transistor pair 90 provides current drive capabilities to the drive line 18. A third CMOS transistor pair 96 includes p-channel transistor 98 and n-channel transistor 100. The drain of transistor 98 is connected to the drain of transistor 100, the junction of which is connected to the gates of the transistors of the CMOS pair 90. CMOS transistor pair 96 need not have the current drive capabilities as those of transistors pairs 78 and 90, but CMOS pair 96 does provide an inverting function so that the drive line 18 is driven with an oscillator signal 180° out of phase with respect to that which drives the bit line 20. While not shown, the refresh drivers 78 and 90 can be connected by plural drive lines and bit lines to simultaneously refresh many cells. In order to avoid the loss of data during refresh, the memory architecture should be arranged such that the cells to be refreshed in a common cycle have available sense amplifiers to temporarily store the data therein.

As noted in FIG. 3, a number of memory cells, each defined by a ferroelectric capacitor 12 and a switching transistor 14, are connected between the drive line 18 and the bit line 20. Also, a transistor 110 is connected between the drive line 18 and the circuit common. Transistor 110 is operative during a data rewrite operation which follows a refresh operation.

As noted above, an isolation transistor 60 is connected between the bit line 20 and the sense amplifier 22. The isolation transistor 60 is driven by a logic NOR gate 116. Of the two inputs of the logic gate 116, one input (B) is driven by the control and refresh circuit 62 so that isolation and conductance can be controlled during the refresh sequence. The other input of the NOR gate 116 is coupled to the output of an AND gate 117. One input of the AND gate 117 receives an A signal, while the other input receives a lockout (LO) signal from the control and refresh circuit 62. It is contemplated that the A input of the AND gate 117 will be controlled by conventional read/write circuitry (not shown) so that normal read and write operations can be carried out independently of the control and refresh circuit 62. The B input of the NOR gate 116 and the lockout signal can likewise be controlled during the refresh sequence to the exclusion, and thus transparent to the other circuits of the chip.

The sense amplifier 22 is a conventional DRAM-type of sense amplifier with transistors 120 and 122 having the gates thereof connected in common and to both a conductor 124 and a data out (inverted) terminal 136. A reference voltage ($V_{ref}$) of about one-half $V_{cc}$ is coupled to the conductor 124 through a transistor 125. The transistor 125 represents a high impedance between the sense amplifier 22 and the reference voltage. More particularly, the magnitude of the reference voltage is selected to be about midway between high and low cell readout voltages on the bit line 20.

In like manner, transistor 126 and 128 have common gate connections connected to both a conductor 130 and a data out terminal 132. The source terminal of the isolation transistor 60 is connected to the source terminal of transistor 120, as well as to the drain terminal of transistor 122. The common gate connection of transistors 126 and 128 is connected to the drain terminal of a transistor 134. The source terminal of transistor 134 is connected to the circuit common, while the gate thereof is driven by a signal $V_2$, which signal is provided as an output by the control and refresh circuit 62.

The source terminal of transistor 126 is connected to the drain terminal of transistor 128, which connection also defines the inverted data output 136. The voltage at the common gate connection of transistors 120 and 122 and the inverted data output 136 can be pulled to circuit common by way of transistor 138. Transistor 138 is driven by the $V_2$ signal. The supply voltage $V_{cc}$ is switchably connected to the sense amplifier 22 by way of transistor 139. The transistor 139 is controlled by a precharge signal PC. While the sense amplifier 22 shown is provided with complementary data outputs, only one need be utilized to drive the data I/O and decoder 64, shown in FIG. 2.

The control and refresh circuit 62 includes decoding and timing circuits effective to control the circuits of the array to accomplish an internal read operation prior to a refresh operation, and then a data rewrite operation. The internal read operation, the refresh operation and the rewrite operation are preferably carried out without initiation of circuits external to the chip. However, those skilled in the art having available the present disclosure can readily devise circuits such that refresh control, as well as addresses, can be initiated external to the chip. One such embodiment is shown below. The control and refresh circuit 62 is preferably on-chip, and includes a chip access counter 140 comprised of a sufficient number of stages for counting the number of memory access cycles before initiating a refresh operation. In the preferred embodiment, it is contemplated that the ferroelectric memory chip will undergo $10^{10}$ access cycles before undergoing a refresh sequence. It is contemplated that the chip access counter 140 will have a modulus equivalent to the number of counts which can occur between refresh sequences. Preferably, the chip access counter 140 comprises a number of stages, with several of the stages having one or more ferroelectric capacitors so at least a portion of the counter is nonvolatile. The 8-10 least significant digits of the counter will not have ferroelectric components, which would otherwise incur the same fatigue as the memory cells due to repeated cycling. With this arrangement, should the memory chip ever be removed from the circuit, or should power be removed from the chip itself, the counter 140 will maintain an accurate count of the number of times the chip has been accessed. Nonvolatile ferroelectric counters are described in U.S. Pat. Nos. 2,872,661 and 3,082,409, the disclosures of which are incorporated herein by reference. Also, the counter 140 may have inputs connected to a load register 142 to preset the counter to a predefined count. The output of the counter 140 is connected to a decoder 144 to decode the predefined count which initiates the refresh sequence. The output of the decoder 144 is connected to timing and control circuits 146 which provide all the timing signals for accomplishing the refresh sequence. One output 150 of the timing circuit 146 is coupled to an oscillator 148 for enabling operation thereof. Preferably, the oscillator 148 is an RC type of gated square wave generator that does not operate until enabled by the timing signal on line 150. The output of the oscillator 148 is connected to the input 84 of the drive line decoder circuits 48.

The operation of the memory refresh circuits is described below in connection with read, refresh and rewrite operations. The waveforms shown in FIG. 4 in conjunction with the circuits of FIG. 3 are effective to refresh either a row or a column of memory cells at a time. As noted in FIG. 4, the waveforms depict three general areas of memory operation, namely, read, refresh and rewrite operations. Moreover, once it is determined that a refresh sequence is to be carried out, the control and refresh circuits 62 generate all the timing signals shown in FIG. 4 to carry out the sequence of the three memory operations. The refresh sequence is carried out automatically, transparent to the circuits external to the chip, except for the time requirements needed for refreshing all the cells of the memory. It is contemplated that the entire refresh sequence of a 64K bit memory will take about ten milliseconds, a time comparable to that of conventional DRAM memories.

During a refresh sequence, the memory cells of a row are first read so that the data stored therein can be temporarily latched in the associated sense amplifiers, and then later rewritten back into the cells after the actual refreshing of the ferroelectric capacitor material. As noted above, once a refresh sequence is to be carried out, for example after $10^{10}$ memory accesses, the control and refresh circuit 62 automatically initiates a read operation. With particular reference to FIG. 4, appropriate addresses are applied by an on-chip address counter (not shown), wherein the word line of, for example cell 10, is driven to a logic high level, as shown by reference numeral 160. In practice, the switching transistor 14 is driven into conduction so that the ferroelectric capacitor 12 is connected directly to the bit line 20. Typically, the word line voltage will be bootstrapped to a voltage above $V_{cc}$, thereby allowing a greater amount or charge to be transferred. A bootstrapped word line also enhances the application of a full voltage across the ferroelectric cell capacitor 12 during refresh. Next, the drive line 18 is driven to a logic high level by the decoder 70, such signal indicated by reference numeral 162. The transition of the drive line voltage from a low level to a high level causes electrical charge to be distributed from the cell 10 between the capacitance of the ferroelectric capacitor 12 and the parasitic capacitance 26 of the bit line 20. The charge distributed between such capacitors 12 and 26 is proportional to the polarization state stored in the ferroelectric capacitor 12. For example, if the application of the drive line pulse 162 causes the polarization state of the ferroelectric capacitor 12 to change, substantially more charge will be distributed between the capacitors 12 and 26. The converse is true for the other polarization state, where no ferroelectric switching occurs when the drive line 18 transitions to logic high level. In other words, the parasitic capacitance 26 stores different amounts of electrical charge, depending upon the polarization state of the ferroelectric capacitor 12. Since the charge stored by the parasitic bit line capacitance 26 is proportional to the voltage across such capacitor, the voltage on the bit line 20 is proportional to the polarization state initially stored in the ferroelectric capacitor 12.

Next, a $V_2$ signal is generated by the control and refresh circuit 62 to drive the sense amplifier 22 into an astable state so that when connected to the bit line 20, the sense amplifier 22 can be further driven into a stable latched state corresponding to the polarization state stored in the ferroelectric capacitor 12. The $V_2$ signal is shown as reference character 164 as it transitions to a high level, and then back to a low level. While the $V_2$ signal is shown occurring subsequent to the word line and drive line signals 160 and 162, such signal can occur during or before the noted signals. Shortly after the $V_2$ signal goes to a logic high state, the sense amplifier precharge signal (PC) goes high and stays high for the remainder of the refresh sequence. After the bit line 20 has been charged to the appropriate state by the reading of the ferroelectric capacitor 12, and after the sense amplifier 22 has been placed into an astable state, the B signal is generated by the control and refresh circuit 62 and applied to the NOR gate 116. In this manner, the isolation transistor 60 is driven into conduction to connect the bit line 20 to the sense amplifier 22. During the refresh operation, the lockout (LO) signal becomes active to prevent off chip accesses from being carried out. The sense amplifier 22 then switches in a conventional manner to a stable latched state depending upon the voltage across the parasitic bit line capacitance 26. The B signal which drives isolation transistor 60 is shown by reference numeral 166. Once the appropriate digital state has been established in the sense amplifier 22, the isolation transistor 60 drive signal is removed, whereupon the bit line 20 is isolated from the sense amplifier 22.

With specific reference again to FIG. 4, the voltage on the bit line 20 is shown generally as reference numeral 168. Subsequent to the rising edge of the drive line signal 162, charge is transferred to the bit line 20. The solid line 170 associated with the bit line voltage 168 represents one polarization state, while the broken line 172 shows the voltage on the bit line 20 in response to the other polarization state. Subsequent to the rising edge of the isolation transistor drive signal 166, the sense amplifier 22 switches to the appropriate state, as shown by reference numeral 174. Once the sense amplifier 22 switches to the appropriate state, the bit line 20 is driven to the appropriate logic state, as shown by reference numerals 176 or 178. Also, once the sense amplifier 22 is driven into the appropriate state, the data out terminal 132 yields a digital state corresponding to the polarization state initially stored in the ferroelectric capacitor 12. The data out signal is shown by reference character 180. From the foregoing, an internal read operation initiated by the control and refresh circuit 62 causes the polarization state of the memory cell 10 to be transferred and temporarily stored as a digital signal in the sense amplifier 22.

The next event in the refresh sequence is the refresh operation itself, as labeled in FIG. 4. During the refresh cycle, the word line is again driven to a logic high level, as shown by reference numeral 183. The switching transistor 14 is driven into conduction and effectively connects the ferroelectric capacitor 12 between the drive line 18 and the bit line 20. The refresh operation commences when the control and refresh circuit 62 drives the C signal 182 to a logic high level, thereby driving the transfer gates 72, 74 and 86, 88 into conduction. With this action, the drive line 18 is connected to the CMOS driver 90, and the bit line 20 is connected to the CMOS driver 78. As noted above, the LO signal is driven to a logic low state to lock out any inadvertent read operations which may otherwise be undertaken by control signals applied externally to the chip. As can be appreciated, the signal drive to the gates of the transistors 72, 74 and 86, 88 can be boosted to provide full drive capabilities of the refresh voltage across the ferroelectric capacitors. During the read and refresh operations, the E signal is maintained at a logic low level.

The oscillator 148 is then gated on by the D signal 184 on line 150. As noted above, the oscillator 148 provides digital output signals at a frequency of about 5–10 MHz. Also, the oscillator enable signal 184 has a timed duration of about ten microseconds to thereby generate about one hundred oscillator cycles. It is contemplated that one hundred, or fewer, cycles is adequate to fully refresh the ferroelectric material. If too many oscillator cycles are allowed to occur, capacitor fatigue may be experienced. Other suitable frequencies and durations can be utilized. The oscillator signal 186 is coupled by way of conductor 84 to the CMOS driver 78 and inverter 96. CMOS driver 78 provides a single inversion of the oscillator signal, while CMOS pairs 90 and 96 provide a double inversion. As a consequence, the oscillator drive signals applied to the drive line 18 and the bit line 20 are out-of-phase, and thus a maximum voltage appears therebetween. As noted above, by utilizing CMOS transistor pairs 78 and 90, substantially the full extent of the chip supply voltage, between ground and $V_{cc}$, can be applied between the drive line 18 and the bit line 20.

Figure 5:
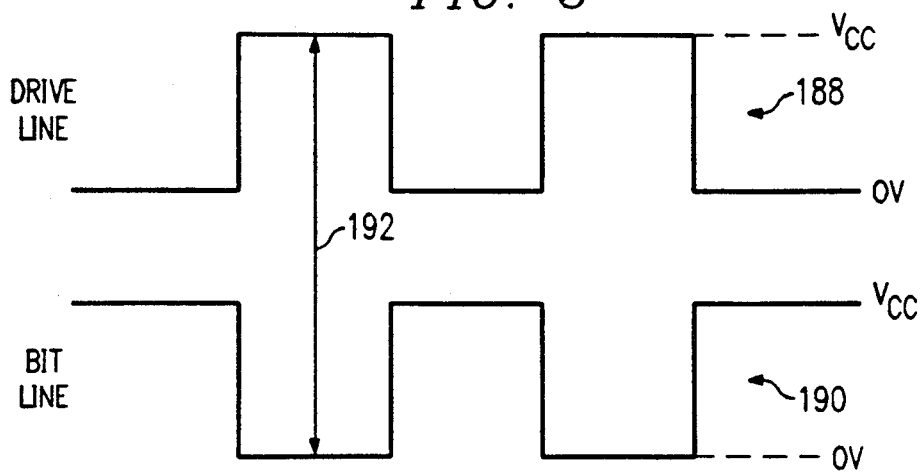
FIG. 5 is a detailed waveform of the drive line and the bit line voltage during the refresh operation.

With brief reference to FIG. 5, there is shown the oscillator drive signal 188 which drives the drive line 18, and the out-of-phase oscillator drive signal 190 which drives the bit line 20. As can be appreciated, the oscillator half cycles shown by numeral 192 impress a full $V_{cc}$ voltage between the drive line 18 and the bit line 20, and thus across the ferroelectric capacitor 12. The refresh voltage applied between the drive line 18 and the bit line 20 is greater in magnitude than the ferroelectric cell capacitors experience during a normal write operation. The reason for this is that when writing the memory cell, the voltage impressed across the cell capacitor by the sense amplifier 22 is reduced by an amount which is lost between the source and drain terminals of the isolation transistor 60. During the refresh operation, the refresh voltage does not appear across the isolation transistor, and thus a greater extent of the refresh voltage is developed across the ferroelectric element. It is also important to appreciate that by refreshing the ferroelectric capacitors according to the invention, and in further contrast to normal write operations, the capacitors are alternately switched between opposite polarization states. This also contrasts with normal read operations where only about one half of $V_{cc}$ is impressed across the ferroelectric cell capacitor.

Because it is contemplated that the ferroelectric memory chip of the invention will be operated with a single supply voltage, the CMOS transistor drivers 78 and 90 are connected between a $V_{cc}$ supply voltage and circuit common. However, if it is desired to impress a higher voltage between the drive line 18 and the bit line 20, the source terminals of transistors 80 and 92 can be connected to a voltage higher than $V_{cc}$, or the drain terminals of transistors 82 and 94 can be connected to a negative voltage, or both can be connected to the noted voltages for obtaining even a greater voltage across the drive line 18 and the bit line 20. Such voltages can be either generated internally by charge pump techniques, voltage boosting techniques, or made accessible by way of external pins provided with the memory chip.

It is believed that ferroelectric capacitor fatigue may result as a consequence of domain pinning, i.e., populations of domains that require higher coercive fields in order to switch. It is also believed that this population of domains can at least be partially converted back to unpinned domains with the application of the higher-than-normal voltage across the ferroelectric capacitor. Experimental tests indicate that with the application of a higher-than-normal voltage, the polarization of the domains is almost completely recovered, and thus the fatigue phenomenon can be electrically reversed. As a result, the endurance of ferroelectric memory cells can be extended by the application of a refresh voltage to the ferroelectric elements.

Subsequent to the refresh operation noted in FIG. 4, the data state stored in the sense amplifier 22 is written back into the cell 10 by appropriately polarizing the ferroelectric capacitor 12 to its original state. This is accomplished during the rewrite operation, also labeled in FIG. 4. Data is rewritten into the revitalized memory cell 10 by maintaining the word line signal 183 at a logic high level and by driving the drive line 18 to a logic low level, as shown by reference numeral 194. The control circuit 62 generates a signal (E) to drive the transistor 110 into conduction and pull the drive line 18 to the logic low level. While the drive line 18 is at a logic low level, the isolation transistor 60 is also driven into conduction, as noted by drive signal 196. As a result, the correct polarization state is rewritten back in the ferroelectric capacitor 12. The rewrite operation terminates by removing the word line signal, then the drive line clamping signal and the signal to the isolation transistor 60.

While the application of a cyclic higher-than-normal voltage across the ferroelectric capacitor is effective to refresh it, it is believed that refreshing can also be enhanced by extending the time period by which a ferroelectric capacitor 12 experiences either a normal voltage thereacross, or a higher voltage. Accordingly, by extending the pulse widths of the oscillator 148, the ferroelectric capacitor 12 can be refreshed, at the expense of longer time periods. A certain degree of ferroelectric material refreshing can be accomplished with a single long pulse of a normal voltage across the capacitor. Also, it is believed that ferroelectric memory endurance can be optimized by carrying out the refresh sequence at uniform time intervals, such as every week, or after successive fewer numbers of accesses. In other words, while the chip access counter 140 was programmed to initiate a refresh sequence after $10^{10}$ accesses, subsequent refresh sequences would occur on the happening of fewer access cycles. For example, the second refresh cycle may occur after $0.5 \times 10^{10}$, the next after $10^9$, and so on. It is believed that the fatigue rate of the ferroelectric material increases subsequent to each refresh operation, and thus in order to maintain a predetermined level of memory integrity, the refresh operations should occur more frequently during use.

Figure 6:
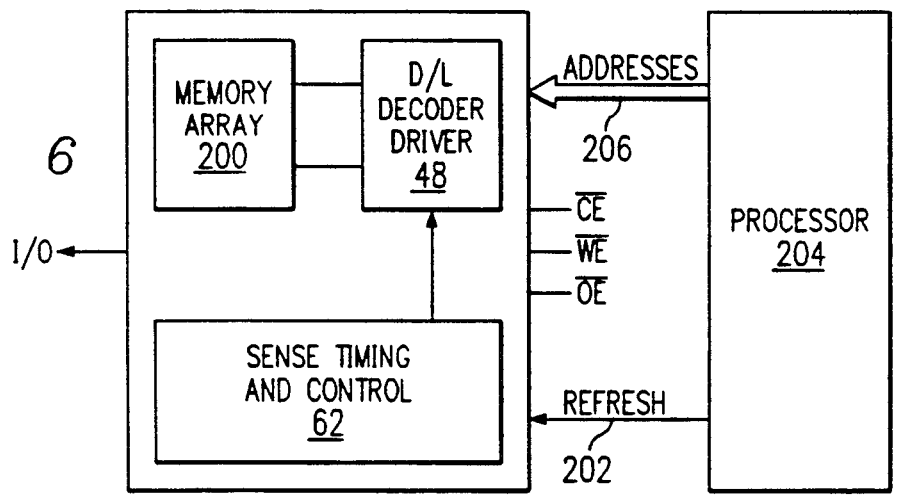
FIG. 6 is a generalized block diagram illustrating off-chip refresh control of a ferroelectric memory.

While FIG. 3 and the associated waveforms illustrate a ferroelectric memory with on-chip refresh circuits, it should be understood that memory refresh operations can be carried out under control of external circuits, such as a processor. In other words, a ferroelectric memory chip may include the timing circuit 146, the oscillator 148 and the drive line decoder 48 shown in FIG. 3, with the other major control circuits residing in off-chip equipment. Such a configuration is shown in FIG. 6. Illustrated is an array 200 of a number of rows and columns of ferroelectric cells, and a drive line decoder 48. Also in the control and refresh circuit 62 is an oscillator and the timing circuit. However, the timing circuit 146 is connected to an external refresh terminal 202. A processor 204, which may be of the type that typically accesses such memories, supplies a refresh signal to terminal 202, as well as addresses on the bus 206. Also, the write enable and chip select signals are controlled by the processor 204 to carry out the refresh sequence which comprises the read, refresh and write operations. The advantage of the embodiment shown in FIG. 6 is that the processor 24 can be programmed to carry out the refresh sequence at any time, such as after a predefined interval of time, or after a predefined number of memory accesses, or on the satisfaction of other criteria. Another advantage is that the processor 204 can carry out the refresh operation during a period of low memory use. Additionally, the processor 204 can be programmed so that during a refresh operation, other normal accesses of the memory can be suspended until the refresh operation is completed. While the processor 204 is shown separate from the ferroelectric memory in FIG. 6, it should be understood that indeed the ferroelectric memory itself may be integrated on the same chip as the processor 204, such as in a microcontroller.

To that end, a processor operating with a nonvolatile ferroelectric memory can be highly advantageous during processor restart, subsequent to power failures of the processor. By utilizing a ferroelectric memory, the processor can restart without rebooting, i.e., a "warm" start. In other words, data currently in the memory during the processor failure is not lost, and thus the data need not be read from an external disk and written into the dynamic memory. By utilizing a warm start, processor restart operations would be substantially instant, in that the state vectors, code and data would remain stored in the nonvolatile memory.

Figure 7:
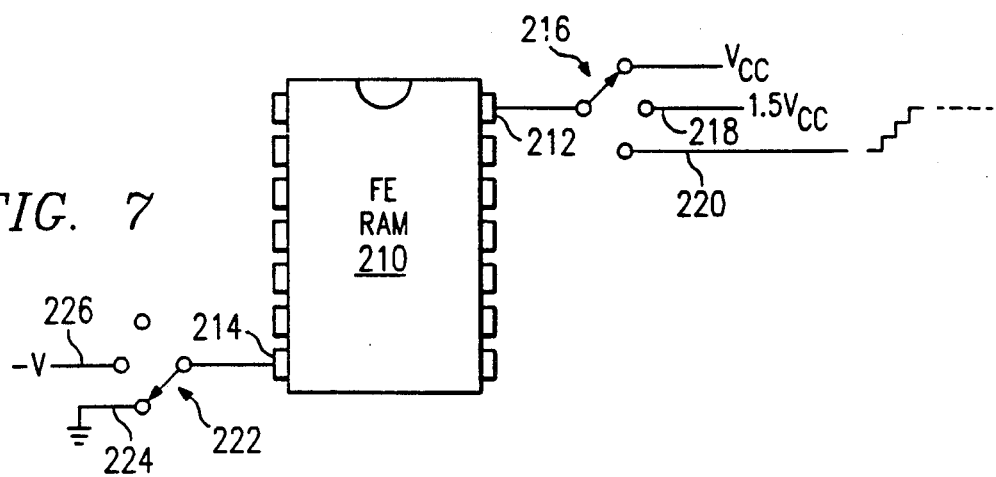
FIG. 7 illustrates the manner in which a conventional ferroelectric memory can be refreshed by selection of external supply voltages.

Yet another embodiment for accomplishing a refresh operation is shown in FIG. 7. A standard packaged ferroelectric RAM 210 is shown having a pin 212 for supplying a DC voltage to the chip, as well as a pin 214 for connection to a circuit common. The packaged memory chip 210 is preferably of the type not having any kind of refresh circuits. Rather, such memory operates according to well known ferroelectric memory operations. However, there is illustrated a switch 216 which can be connectable to various supply voltages, including the standard $V_{cc}$ supply voltage. Also, the switch 216 can be connected by a contact 218 to a higher voltage, namely 1.5 $V_{cc}$. When so connected to the 1.5 $V_{cc}$ supply voltage, the ferroelectric RAM 210 can be driven with signals to carry out a normal read operation. However, because the supply voltage is higher than the normal $V_{cc}$ voltage, a greater voltage will be impressed across the ferroelectric cell capacitors, thereby refreshing such capacitors. Also shown is an additional switch contact 220 which can connect the supply voltage pin 212 to a programmable supply voltage. Programmable power supplies are well known in the art and can provide an output voltage based upon a programmable input. As noted, the programmable supply voltage may provide a 1.7 $V_{cc}$ supply voltage during a first refresh operation, and higher voltages in a stepped manner according to subsequent refresh operations. When the ferroelectric material is refreshed according to this technique, the refresh is carried out during the read operation itself, and no subsequent rewrite operation need be carried out. It should be understood that with standard ferroelectric destructive read cycles, a restore cycle occurs in which the data is automatically rewritten into the ferroelectric cells.

As an alternative, or in addition thereto, the common terminal 214 of the ferroelectric memory package 210 can be connected during normal operation to a circuit common, denoted by reference numeral 224. The switch 222 can be switched to another contact 226 for applying a negative voltage to the common terminal 214. In this manner, the voltage impressed across the ferroelectric capacitors can be further increased to refresh the ferroelectric material. Again, and while not shown, terminal 214 can be switchably connected to a negative programmable supply voltage to make available desired negative voltages connectable to the common terminal 214.

From the foregoing, various methods and apparatus have been disclosed for refreshing ferroelectric capacitive elements. It should be understood that while various circuits and techniques are described above in connection with the preferred and other embodiments of the invention, those skilled in the art may apply the principles and concepts of the invention to other memory circuits. For example, refresh capabilities can be supplied with differential memory cells having a pair of ferroelectric capacitors. In addition, various "shadow" RAM memories are known in the art, of the type having a standard DRAM type of cell, with a nonvolatile backup of ferroelectric cells. In such type of memories, the refresh capabilities can also be implemented to extend the endurance of the ferroelectric components. Further, the principles and concepts of the invention can be applied to non-dynamic type of memories, such as ferroelectric shift registers and other ferroelectric digital circuits. Indeed, the principles and concepts of the invention can be applied as well to analog circuits employing ferroelectric capacitive components. Accordingly, it is to be understood that many changes in detail may be made as a matter of engineering choices without departing from the spirit and scope of the invention, as defined by the appended claims.

What is claimed is:

1. In a nonvolatile memory cell having a ferroelectric capacitor, a switching transistor, a word line, a bit line and a drive line, a method for extending an endurance of the ferroelectric capacitor, comprising the steps of:
   accessing the memory cell by addressing the word line;
   causing a read voltage of a first magnitude to be applied across the ferroelectric capacitor to read the memory cell with respect to a polarization state; and
   carrying out at least one cycle including the steps of applying a refresh voltage to a second magnitude greater than the read voltage of the first magnitude and of one polarity across the ferroelectric capacitor to revitalize a ferroelectric material thereof, and applying the refresh voltage of the second magnitude and of a polarity opposite said one polarity across the ferroelectric capacitor to refresh the ferroelectric capacitor and revitalize the ferroelectric material thereof.

2. The method of claim 1, further including driving the drive line during said cycle with the refresh voltage and maintaining the bit line at a circuit common voltage.

3. The method of claim 2, further including maintaining the drive line during a different portion of the cycle at a circuit common voltage and increasing the bit line voltage to said refresh voltage of the second magnitude.

4. The method of claim 1, further including counting the number of memory read and write access cycles to which the memory cell has been subjected, and on a predefined count, initiating said refresh of said ferroelectric capacitor.

5. The method of claim 1, further including carrying out a plurality of said cycles to define a single refresh operation for said memory cell, and waiting a predefined period of time after one refresh operation before initiating a subsequent refresh operation.

6. The method of claim 5, further including waiting nonuniform periods of time between said refresh operations.

7. The method of claim 5, further including periodically refreshing the memory cell in a manner such that the time periods become shorter between refresh operations.

8. The method of claim 1, further including applying a supply voltage of about 5 volts to a device having said cell incorporated therein, and reading the cell by applying approximately 2-3 volts across the ferroelectric capacitor, and refreshing the cell by applying approximately 5 volts across the ferroelectric capacitor.

9. The method of claim 1, wherein a semiconductor chip includes an array of said ferroelectric capacitor cells, and wherein said refresh is carried out by increasing a supply voltage to said chip.

10. The method of claim 1, further including during each said refresh cycle, subjecting the ferroelectric capacitor to a plurality of pulses, each of which has a magnitude corresponding to said second magnitude.

11. A circuit for carrying out the method of claim 1.

12. A method of extending the endurance of a memory array having a number of addressable nonvolatile memory cells, each memory cell having a ferroelectric capacitor connectable between a drive line and a bit line, comprising the steps of:
   a) accessing a memory cell of the array to revitalize a ferroelectric capacitor by applying an address to a word line associated with the memory cell to connect the ferroelectric capacitor between the drive line and the bit line;
   b) reading the memory cell by applying a read voltage across the ferroelectric capacitor of the accessed memory cell;
   c) isolating the bit line from a sense amplifier;
   d) when the bit line is isolated from sense amplifier, revitalizing the ferroelectric capacitor of the accessed memory cell by applying a voltage greater than the read voltage across the ferroelectric capacitor via the drive line and the bit line to revitalize the ferroelectric capacitor material; and
   e) periodically revitalizing the ferroelectric capacitors of the other memory cells of the array by sequentially repeating steps b) through d).

13. The method of claim 12, further including revitalizing the array by initiating a memory read of the memory cells of the array.

14. The method of claim 12, further including:
   reading the memory cell and temporarily storing associated data in the sense amplifier before carrying out the isolation step;
   revitalizing the memory cell;
   connecting the sense amplifier to the revitalized bit line; and
   rewriting the temporarily stored data back into the memory cell.

15. The method of claim 12, further including maintaining the bit line voltage constant and increasing the drive line voltage to said refresh voltage during said revitalizing.

16. The method of claim 12, further including increasing the voltage across the ferroelectric capacitor to a magnitude of at about 50% greater than the magnitude of the read voltage impressed across the capacitors during a read cycle.

17. The method of claim 12, further including applying a voltage of about $V_{cc}/2$ to the ferroelectric capacitor of the memory cell during a normal read operation, and applying a voltage of about $V_{cc}$ across the ferroelectric capacitor during a refresh cycle.

18. The method of claim 17, wherein said array includes row and columns of cells, and further including sequentially refreshing each row of cells during a respective single refresh cycle.

19. Circuits for carrying out the method of claim 12.

20. A ferroelectric memory array powered by a DC supply voltage, comprising:

an array of memory cells, each cell including a ferroelectric capacitive element;

circuits for accessing the array to address at least one memory cell;

a voltage drive circuit for applying a voltage of a first magnitude across the ferroelectric capacitive element of the addressed memory cell during a normal memory read/write operation; and means for applying a second voltage of a magnitude greater than said first magnitude across the capacitive element of each addressed memory cell during a first refresh operation without increasing said DC supply voltage to revitalize ferroelectric material of the capacitive elements.

21. The memory array of claim 20, wherein said means for applying drives the capacitive element with the second voltage to refresh the ferroelectric material of the capacitor during said first refresh operation that is subsequent to a memory read operation.

22. The memory array of claim 20, further including a counter for counting a number of memory read and write access cycles, and means responsive to a predetermined count for causing the first refresh operation to be initiated.

23. The memory array of claim 22, wherein said counter is formed on a semiconductor chip with said array.

24. The memory array of claim 22, wherein said counter has plural stages that are nonvolatile, and other less significant bit counter stages that are volatile.

25. The memory array of claim 22, wherein said memory array is formed on a silicon chip, and said counter is located off said chip.

26. The memory array of claim 20, wherein said array is formed on a semiconductor chip supplied with a supply voltage defined as $V_{cc}$, and means for increasing the supply voltage during a refresh operation occurring subsequent to the first refresh operation.

27. The memory array of claim 20, further including a common drive line circuit for applying a voltage to a number of ferroelectric capacitive elements of respective cells connected to a common drive line, and a circuit associated with said common drive line circuit for driving the common drive line with a voltage of a first magnitude for read operations, and for driving the common drive line with a voltage of a second magnitude greater than the first magnitude during said refresh operation.

28. The memory array of claim 20, further including a sense amplifier associated with a bit line to which said memory cells are connected, said sense amplifier having a voltage drive circuit for driving said bit line with a first voltage during normal memory operations, and for driving the bit line with said higher voltage during said refresh operation.

29. The memory array of claim 20, further including a drive circuit for applying a refresh voltage directly across each ferroelectric capacitive element.

30. The memory array of claim 20, wherein said drive circuit is connected across a drive line and a bit line each common to plural memory cells of the array.

31. The memory array of claim 30, wherein said drive circuit includes a CMOS transistor pair having a common node connected to the drive line, and another CMOS transistor pair having a common node connected to the bit line.

32. The memory array of claim 31, further including an inverter for inverting a drive signal before being applied to one of said CMOS transistor pairs to provide out of phase signals for driving the drive line and the bit line.

33. A ferroelectric memory array, comprising:

an array of nonvolatile memory cells, each memory cell including a ferroelectric capacitive element;

circuits for accessing word lines of the array to address at least one memory cell;

a bit line common to a number of memory cells for transferring electrical charge thereto from the ferroelectric capacitive elements of the respective addressed memory cells;

a drive line common to a number of memory cells for applying a drive voltage to ferroelectric capacitive elements; and a drive circuit comprising a bit line drive circuit and a drive line drive circuit connected respectfully to said bit line and to said drive line for applying a bit line refresh voltage and a drive line refresh voltage directly across the ferroelectric capacitive element of at least one memory cell associated with the drive line and the bit line, said bit line and drive line refresh voltage being greater in amplitude than that applied across the ferroelectric capacitive elements during normal read/write operations.

34. The ferroelectric memory array of claim 33, wherein during a normal memory cell access the accessed memory cell is configured to distribute electrical charge between the ferroelectric capacitive element and capacitance of the bit line so that the resultant voltage across the ferroelectric capacitive element is always less than V, and during a refresh operation a voltage of at least V is applied across the drive line and the bit line.

35. The ferroelectric memory array of claim 33, further including an oscillator for applying a plurality of refresh voltage pulses to the accessed ferroelectric capacitive element during a refresh operation.

36. The ferroelectric memory array of claim 33, further including a counter for totalizing a number of accesses to the array, and a decoder for decoding a predefined count of said counter, an output of said decoder being operative to initiate a refresh operation.

37. The ferroelectric memory array of claim 36, further including means for presetting the counter to a predefined count.

38. The ferroelectric memory array of claim 33, further including a sense amplifier distinct from said bit line drive circuit.

39. The ferroelectric memory array of claim 38, further including a transistor for coupling the bit line to the sense amplifier, said transistor preventing a full supply voltage from being applied across the ferroelectric capacitive elements during normal read and write operations, and wherein said transistor is placed in a nonconductive state during the application of the drive line and bit line refresh voltages.

40. A method of refreshing cells of a ferroelectric memory chip, comprising the steps of:

increasing a supply voltage connected to a pin of said chip from a first magnitude from which the chip normally operates in read and write operations to a second, greater magnitude; and accessing each cell of the array with said increased magnitude voltage applied to the chip to refresh the ferroelectric material of each cell.

41. The method of claim 40, wherein said accessing step is carried out by reading each memory cell.

42. The method of claim 40, wherein said supply voltage is increased by increasing a positive supply voltage.

43. The method of claim 40, wherein said supply voltage is increased by increasing a negative supply voltage.

44. A ferroelectric memory, comprising:
a plurality of nonvolatile memory cells, each having a ferroelectric capacitive element;
at least one bit line and at least one word line connected to at least one said cell;
at least one drive line connected to said one cell;
a sense amplifier;
an isolation transistor for switchably connecting said bit line to said sense amplifier during reading of the cell, and for isolating the bit line from the sense amplifier during revitalization of the ferroelectric capacitive element of the cell; and
a drive circuit operative during refreshing of the cells for applying a voltage between the drive line and the bit line to revitalize the ferroelectric capacitive element of said one cell.

45. The memory of claim 44, further including an oscillator for driving the drive circuit.

46. The memory of claim 44, further including a counter for totalizing memory accesses, and for initiating a revitalization of the ferroelectric capacitive element after a predetermined number of accesses.

47. The memory of claim 44, wherein said drive circuit includes a first CMOS transistor pair having a common node connected to the drive line and a second CMOS transistor pair having a common node connected to the bit line.

48. The memory of claim 47, wherein each said CMOS transistor pair is connected in series between a supply voltage of said memory and a circuit common of said memory.

49. In a memory cell having a ferroelectric capacitor, a switching transistor, a word line, a bit line and a drive line, a method for extending an endurance of the ferroelectric capacitor, comprising the steps of:
accessing the memory cell by addressing the word line;
causing a voltage of a first magnitude to be applied across the ferroelectric capacitor to read or write the memory cell with respect to a polarization state;
counting the number of memory access cycles to which the memory cell has been subjected, and on a predefined count, initiating a refresh operation;
carrying out the refresh operation by applying a voltage of a second magnitude greater than the first magnitude across the ferroelectric capacitor to refresh the ferroelectric material of said capacitor; and
refreshing the cell with increased magnitudes of refresh voltage at each subsequent refresh operation.

* * * * *

UNITED STATES PATENT AND TRADEMARK OFFICE
CERTIFICATE OF CORRECTION

PATENT NO. : 5,270,967
DATED : December 14, 1993
INVENTOR(S) : Reza NMI Moazzami, et al.

It is certified that error appears in the above-identified patent and that said Letters Patent is hereby corrected as shown below:

Col. 15, line 31, delete "to", insert --of--.
Col. 16, line 63, delete "row", insert --rows--.
Col. 17, line 13, after "revitalize", insert --a--.

Signed and Sealed this

First Day of November, 1994

Attest:

BRUCE LEHMAN

Attesting Officer

Commissioner of Patents and Trademarks